United States Patent [19]

Peyre-Lavigne

[11] 4,332,837

[45] Jun. 1, 1982

[54] PASSIVATION PROCESS AND STRUCTURE FOR SELF-ALIGNMENT WITH THE LOCATION OF A MASK

[75] Inventor: Andre Peyre-Lavigne, Paris, France

[73] Assignee: Thomson-CSF, Paris, France

[21] Appl. No.: 160,363

[22] Filed: Jun. 17, 1980

[30] Foreign Application Priority Data

Jun. 19, 1979 [FR] France .................................. 79 15661

[51] Int. Cl.³ ..................... H01L 21/24; H01L 21/314
[52] U.S. Cl. ......................................... 427/57; 204/65; 156/653; 156/656; 156/657; 427/86; 427/88; 427/93; 427/99; 427/273
[58] Field of Search ........................ 427/88, 93, 86, 57, 427/99, 273; 156/653, 656, 657; 204/15

[56] References Cited

U.S. PATENT DOCUMENTS

| 3,393,091 | 7/1968 | Hartmann et al. | 427/91 |
| 4,084,986 | 4/1978 | Aoki et al. | 427/93 |
| 4,180,596 | 12/1979 | Crowder et al. | 427/99 |
| 4,194,934 | 3/1980 | Blaske et al. | 427/86 |

OTHER PUBLICATIONS

Aoki et al., "'SIPOS' A New Technology for Silicon Surface Passivation", JEE, No. 109, p. 44–48, Jan. 1976.
Chapman "Depositing Platinum Silicide Contacts", IBM TDB vol. 15, No. 4, p. 1341, Sep. 1972.
Crowder et al., "Use of Silicides in Overlapping Polysilicon Gate Process" IBM TDB, vol. 20, No. 6, p. 2455, Nov. 1977.

*Primary Examiner*—John D. Smith
*Attorney, Agent, or Firm*—Cushman, Darby & Cushman

[57] ABSTRACT

A passivation process and structure with self-alignment with the location of a mask wherein oxygen-doped poly-crystalline silicon is deposited on a semiconductor surface, a part of which is occupied by a silicide or by a silicon-metal eutectic. The sipox deposit is adhesive to the semiconducting parts and not to said part. The invention applies to the miniaturization of semiconductor components and integrated circuits.

9 Claims, 13 Drawing Figures

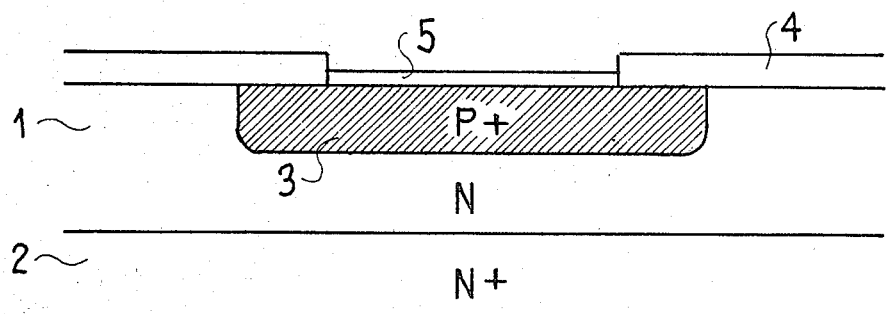
FIG_1-a PRIOR ART
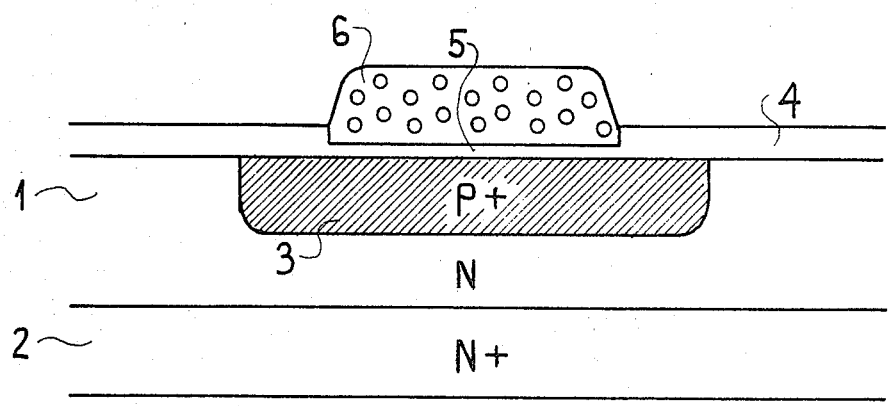
FIG_1-b PRIOR ART
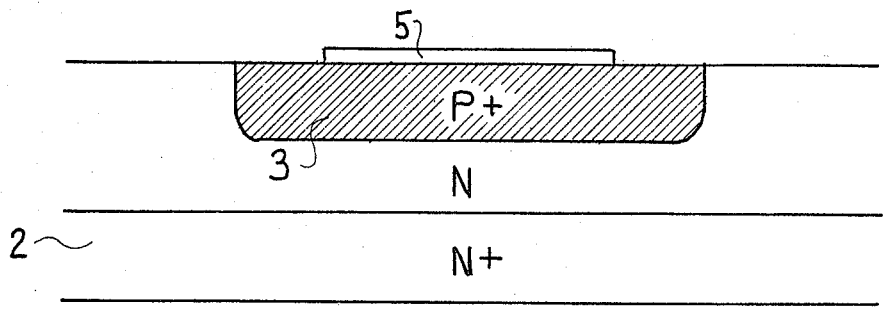
FIG_1-C PRIOR ART

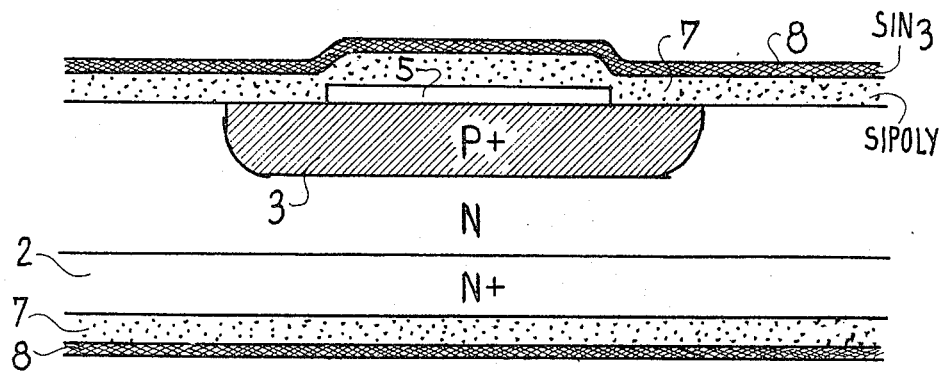
FIG_1-d PRIOR ART
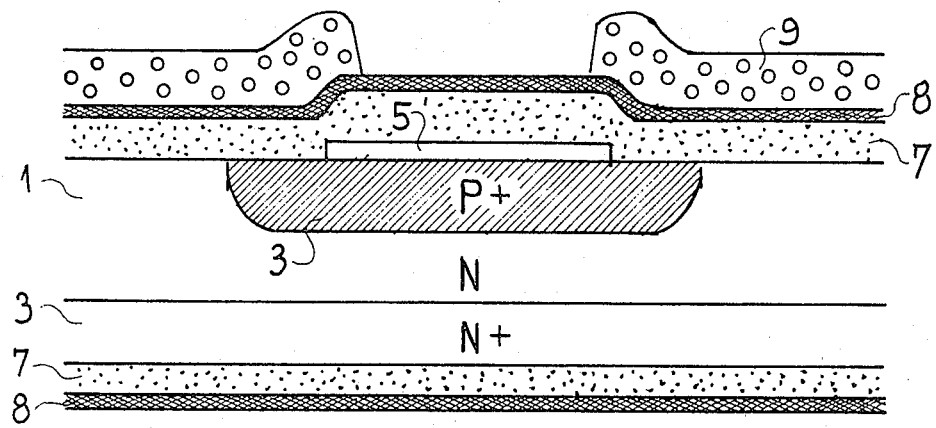
FIG_1-e PRIOR ART
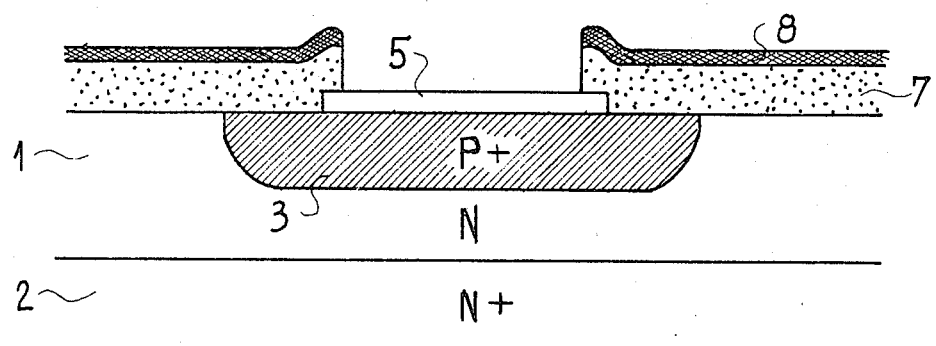
FIG_1-f PRIOR ART

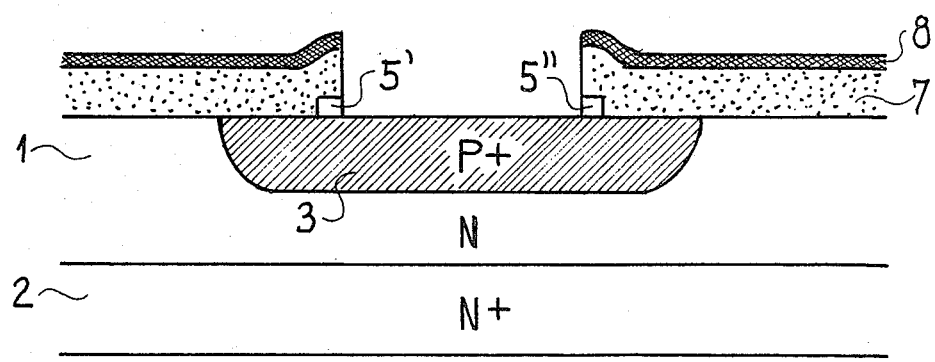
FIG_1-g PRIOR ART

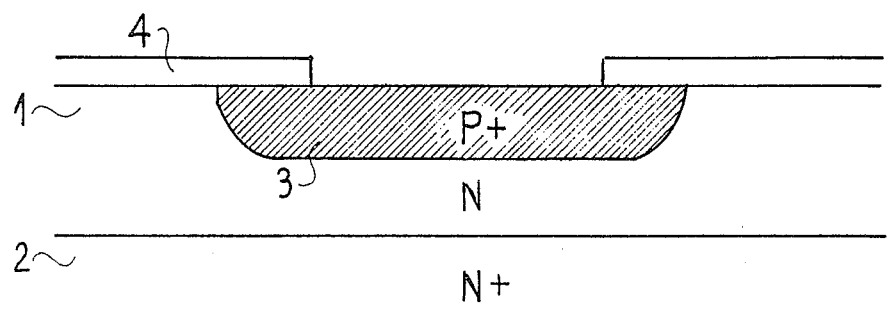
FIG_2-a
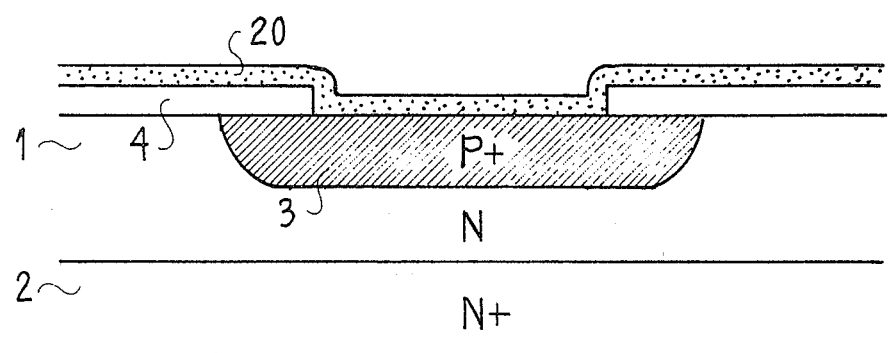
FIG_2-b
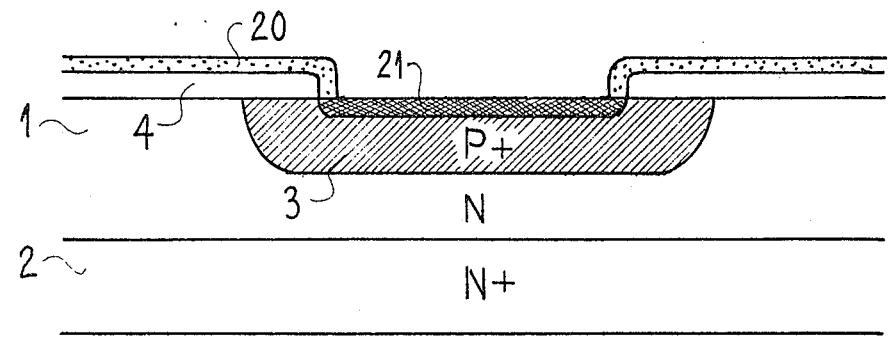
FIG_2-c

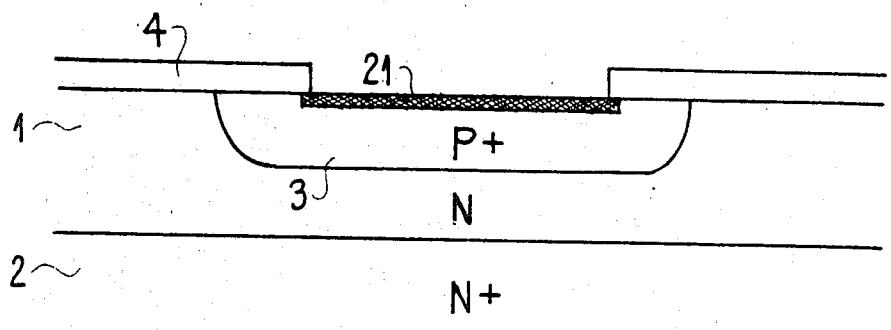
FIG_2-d
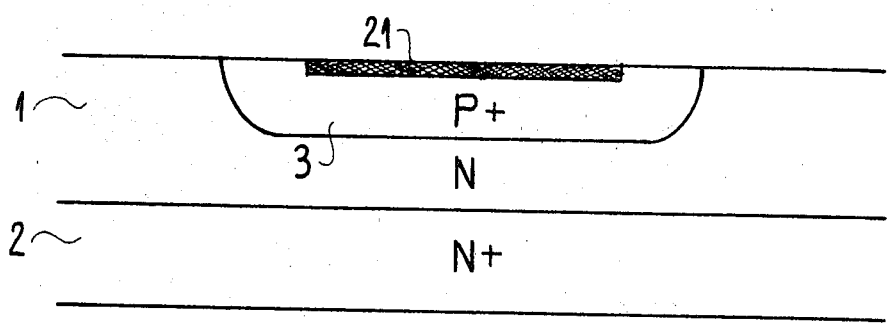
FIG_2-e
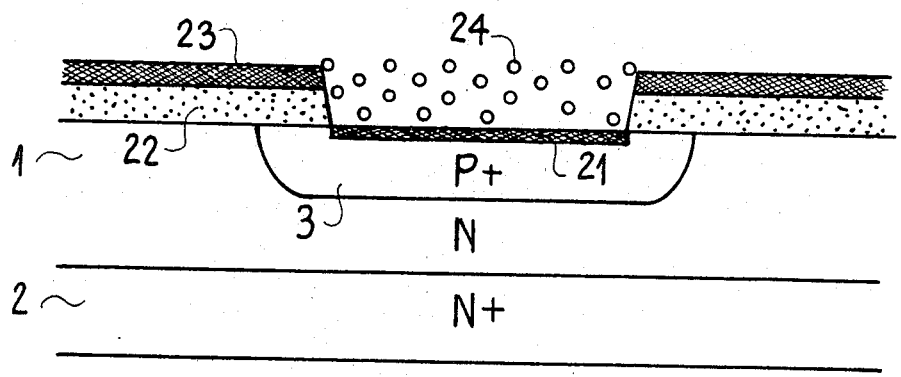
FIG_2-f

PASSIVATION PROCESS AND STRUCTURE FOR SELF-ALIGNMENT WITH THE LOCATION OF A MASK

BACKGROUND OF THE INVENTION

The present invention relates to a passivation process and structure with self-alignment with the location of a mask. More particularly, the present invention relates to a self-aligning process for a passivation layer chemically deposited in the vapor phase on the location of a diffusion mask.

During the manufacture of a planar-type device, it is necessary during certain steps to carry out diffusions in a semiconductor wafer through selected openings provided in a mask formed on the semiconductor wafer, this mask being for example formed from a thermal or pyrolytic oxide layer. The diffusion penetrates into the semiconductor wafer and extends transversely under the masking layer. This masking layer may be maintained during further manufacturing steps to serve as passivation for the surface flush portion of the junction. Nevertheless, in some cases, the leak current in the vicinity of the flush portion of the junction may be too high with such a passivation layer. It is then preferable to replace the masking layer with a layer or an assembly of layers of other passivation materials deposited chemically in the vapor phase. There will be more particularly considered here the case where it is desired to use as passivation agent polycrystalline silicon doped with oxygen, called hereafter sipox, but the invention also applies to the case of other chemical deposits in the vapor phase, for example silicon nitride or silica, doped or not.

To better illustrate the disadvantages of the process of the prior art, there will first of all be described hereafter in detail with reference to FIGS. 1a to 1g a process of the prior art for replacing an oxide mask with a sipox layer.

We consider initially a semiconductor structure comprising a type n layer 1 covered on its lower face with a type n+ layer 2 and in the upper face of which is diffused a p+ type layer 3. This localized layer 3 is obtained by diffusion through a masking layer 4, formed for example by an oxide. The diffusion process selected is such that there is produced, above diffused zone 3, a thin oxide layer 5.

In the following FIG. 1b there is illustrated the depositing of a photosensitive resin layer 6 above the thinner part 5 of the oxide layer, i.e. above the openings in the masking layer 4.

FIG. 1c illustrates the condition of the structure after etching of the silica layer 4 and removal of the photosensitive resin layer 6.

In a further step, illustrated in FIG. 1d, a first layer of polycrystalline silicon doped with oxygen (sipos) 7 is deposited on both faces of the device, followed by a second silicon nitride layer 8.

In the step of FIG. 1e, a resin layer 9 is deposited on the upper face of the wafer and opened in a region corresponding substantially to the openings of the first mask 4. After chemical etching, the structure shown in FIG. 1f is obtained.

In the following step, illustrated in FIG. 1g, the visible part of silica layer 5 is removed by chemical etching. It will be noted that there remain lateral portions 5' and 5" of this oxide layer 5 enclosed under the passivation structure comprising the sipos layer 7 and the silicon nitride layer 8.

Thus, in the process of the prior art, it will be noted that two maskings are provided: the first for forming the localized resin layer 6, of FIG. 1b, the second for forming the localized opening in the resin layer 9. It is because of these two maskings that a certain tolerance must be provided in the dimensions of the masks so as to be certain that the layer of sipos finally obtained will sufficiently cover type p+ zone 3.

An aim of the present invention is to provide a new process for depositing a passivation structure whose basic layer is deposited chemically in the vapor phase, this layer being self-aligned with an initial masking layer through the openings of which localized diffusion has been formed in a semiconductor wafer.

Another aim of the present invention is to provide such a process which is simple to use industrially.

Another aim of the present invention is to provide such a process which lends itself particularly simply to deposition of a metallization layer in the opening provided in the passivation structure.

SUMMARY OF THE INVENTION

These aims as well as others are attained in accordance with the present invention by providing a process for obtaining a localized passivation structure comprising a basic layer deposited chemically in the vapor phase, this layer being self-aligned with a masking layer used during the process for manufacturing a silicon-based semiconductor component, comprising the following steps:

(a) cleaning the surface of the semiconductor in the openings of the mask;

(b) depositing a metal layer able to form a silicide or eutectic having a melting point at a temperature less than a predetermined temperature T with the silicon;

(c) reheating to combine the metal layer and the visible surface of the semiconductor;

(d) removing by selective etching the masking layer and the excess metal in the windows of the mask;

(e) depositing chemically in the vapor phase a layer of sipos, nitride or silica doped or not, and possibly a layer of another passivation agent;

(f) subjecting the wafer to mechanical cleaning, for example by brushing with a fluid under high pressure or ultrasonic agitation to eliminate the part of the sipos, silicon nitride or silica layer which has been deposited in the windows of the mask and which is powdery in nature.

DESCRIPTION OF THE FIGURES

These objects, features and advantages as well as others of the process of the present invention will be explained in more detail in the following description of particular embodiments made with reference to the accompanying figures in which:

FIGS. 1a to 1g serve as a support for the description of a process of the prior art such as set forth above; and FIGS. 2a to 2f serve as a support for the account of a process in accordance with the present invention.

DESCRIPTION OF THE PREFERRED EMBODIMENT

FIG. 2a shows a structure substantially similar to that of FIG. 1a in which similar layers are designated by similar references. It will nevertheless be noted that in this FIG. 2a the oxide layer 5 of FIG. 1a does not exist.

That may result either from having chosen a diffusion process in which such an oxide layer is not formed or else by removing this layer by chemical cleaning after the diffusion step. It will be noted that this cleaning step does not involve a masking step for the difference in thickness between the oxide layers 4 and 5 can be used. In any case, the visible part of layer 3 is carefully cleaned to provide a silicon surface capable of receiving adhering metallizations.

In the following step illustrated in FIG. 2b there is deposited, on the upper face of the wafer, a metal layer 20. This layer may be deposited either uniformly by evaporation as is shown, or else deposited electrolytically solely in the window provided in oxide layer 4.

The metal deposited 20 may be selected from one or other of two categories. The first category is formed of metals such as gold and aluminium forming a eutectic which is in the liquid state at a temperature less than the temperatures currently used in a reactor for depositing polycrystalline silicon doped with oxygen. The second category is formed from metals such as nickel, molybdenum and platinum which are capable of reacting with the silicon to form a silicide.

Then thermal treatment is carried out to obtain, as shown in FIG. 2c, a layer 21 formed from the reaction product between the silicon of layer 3 and the metal of layer 20, this compound being able to be a eutectic or a silicide.

In the following step, as shown in FIG. 2d, the excess metal above layer 21 is removed and possibly layer 20 above the silica mask 4 if there has been uniform deposition of a metal layer during the step of FIG. 2b. After that, as shown in FIG. 2e, the silica mask 4 is removed by chemical etching.

FIG. 2f shows the structure of the present invention after the wafer has been placed in a reactor for depositing a first layer 22 of sipox followed by a second layer 23 of silicon nitride. Layer 24 above layer 31 proves to be a powdery deposit of very low adhesion which can then be easily removed by mechanical action, for example by blasting with a pressurized water jet or by ultrasonic agitation.

Thus a passivation structure 22, 23 is obtained directly aligned with the initial silica mask 4 without any additional masking step. Accordingly, it is pointless providing overdimensioning of each individual component and so the dimension of each component may be reduced, i.e. more components can be manufactured on the same wafer, which is an aim generally sought both for discrete components and for integrated-circuit elements.

There will be set forth hereafter the reasons why the applicant considers at present that the deposit above the silicide or the eutectic is powdery in nature and not very adhesive. Nevertheless, this theoretical account does not form a limitation of the present invention whose results have been ascertained experimentally by the applicant.

In the case where a silicide is formed, i.e. for example in the case where the crystal of layer 20 is nickel, this silicide is etched by means of hydrochloric acid when hot which exists in the reactor for depositioning the layer of polycrystalline silicon doped with oxygen, this deposit being effected at a temperature of 830° C. for example. In fact, the sipox deposit is effected in the presence of $SiCl_2$ which decomposes to provide particularly Si and Cl. There is then formed a volatile metal chloride (ClNi). This metal chloride prevents the gaseous compounds required for the formation of polycrystalline silicon and nitride layers from reacting and nucleating at the surface of silicide layer 21.

In the case where a metal is selected such as gold or aluminium, which have respectively eutectic temperatures with the silicon of 370° C. and 577° C. and, when sipox is deposited at a temperature greater than 680° C., this eutectic is in the liquid state and this is what explains the lack of adhesion of the subsequent sipox layer.

It will be noted that the present invention may be implemented in numerous ways. In particular, the second layer 23 of the passivation structure has been described as being a silicon nitride layer. Other layers have been used, for example pure silica or silica doped with phosphorus.

Once the structure shown in FIG. 2f has been obtained and after the powdery layer 24 has been removed, for numerous practical applications efforts are made to provide a contact from type p+ layer 3. In the case of the present invention, owing to the presence of layer 21, this metal contact may be provided particularly easily. In this case, the advantages of the present invention are particularly evident. In fact, because of the self-alignment of the passivation structure 22, 23 with the initial mask, the lateral limits of layer 21 serving as a support for the metallization are as close as possible to the surface flush portions of p+ type layer 3. Thus is limited, during operation of the semiconductor device obtained, the resistance formed by the part of the p+ layer situated between the frontier of the metallization support layer 21 and the junction zones.

In the cases where it is desired to effect another operation than metallization of the surface of layer 3, it is possible to selectively remove layer 21 by selective etching. In the case where this layer 21 is formed by a silicide, it may be removed with plasma or else by means of hot hydrochloric acid at 830° C. In the case where it is a question of a eutectic, the removal may be effected by means of aqua regia or any other selective etching solution.

Although the accompanying figures show a diode, it is clear that the present invention will find numerous other applications in the field of production of discrete or integrated semiconductor components.

What is claimed is:
1. A process for obtaining a localized passivation structure comprising a basic layer deposited chemically in the vapor phase, this layer being self-aligned with a masking layer used during the process for manufacturing a silicon-based semiconductor component, said process comprising the following steps:
   (a) cleaning the surface of the semiconductor in the openings of the mask;
   (b) depositing a metal layer of a metal able to form with the silicon a silicide or a eutectic having a melting point at a temperature less than a predetermined temperature T;
   (c) reheating so as to combine the metal layer and the visible surface of the semiconductor to form with the silicon a silicide or a eutectic have a melting point at a temperature less than a predetermined temperature;
   (d) removing by selective etching the masking layer and the excess metal in the windows of the mask;
   (e) depositing chemically in the vapor phase at least one layer of a passivation agent;
   from which it results that, in the zones corresponding to the openings of the mask, the deposit of said passivation agent is powdery.

2. The process as claimed in claim 1, wherein the powdery deposit is mechanically removed by means such as brushing with a fluid under high pressure or ultrasonic agitation.

3. The process as claimed in claim 1, in which a metal is used forming a eutectic with the silicon and in which the passivation agent is sipos, wherein the temperature T is the temperature of a reactor in which the depositing of sipos is carried out.

4. The process as claimed in claim 3, wherein the metal is selected from the group comprising gold and aluminium.

5. The process as claimed in claim 1, in which a metal is used forming a silicide, and in which the passivation agent is sipos, wherein this metal is selected from the group comprising nickel, molybdenum and platinum.

6. The process as claimed in claim 5, wherein the step for depositing sipos is carried out at a temperature greater than 800° C., preferably 830° C.

7. The process as claimed in claim 2, wherein there is further provided a step for selective metallization of the opening zones of the passivation structure.

8. The process as claimed in claim 7, wherein the selective metallization is carried out electrochemically.

9. The process as claimed in claim 1, wherein there is further provided a step (f) for baring the semiconductor in the opening zones of the passivation structure.

* * * * *